United States Patent [19]

Micheron

[11] 4,400,634
[45] Aug. 23, 1983

[54] BIMORPH TRANSDUCER MADE FROM POLYMER MATERIAL

[75] Inventor: François Micheron, Paris, France

[73] Assignee: Thomson-CSF, Paris, France

[21] Appl. No.: 214,723

[22] Filed: Dec. 9, 1980

[30] Foreign Application Priority Data

Dec. 28, 1979 [FR] France ............................ 79 31970

[51] Int. Cl.³ ............................................. G11C 13/02
[52] U.S. Cl. ....................................................... 307/400
[58] Field of Search ........................................... 307/400

[56] References Cited

U.S. PATENT DOCUMENTS 3,354,373 11/1967 Fatovic ............................ 307/400 X
3,809,828 5/1974 Haugsjaa et al. ................. 307/400 X
4,250,415 2/1981 Lewiner et al. ..................... 307/400

FOREIGN PATENT DOCUMENTS 2397120 2/1979 France.

OTHER PUBLICATIONS

Electronique et Applications Industrielles No. 252, May 1978, "The Application of Electrets" pp. 15 and 19, p. 17, right column, line 8 through p. 19, last column on the left; FIGS. 9–13.

Primary Examiner—Donald A. Griffin
Attorney, Agent, or Firm—Oblon, Fisher, Spivak, McClelland & Maier

[57] ABSTRACT

The invention relates to bimorph electromechanical transducers made from polymer material.

It specifically relates to a transducer comprising a plurality of superimposed dielectric sheets for forming a bimorph structure, whose deformations are controlled in linear manner by a voltage. None of the sheets is piezoelectric. The linearity of operation is obtained because at least one of the dielectric sheets carries a permanent electric charge.

The invention is applicable to the construction of microphones, telephone receivers, loudspeakers, as well as to the construction of optical components, whose precise, small displacements it is desired to control.

11 Claims, 10 Drawing Figures

FIG. 6
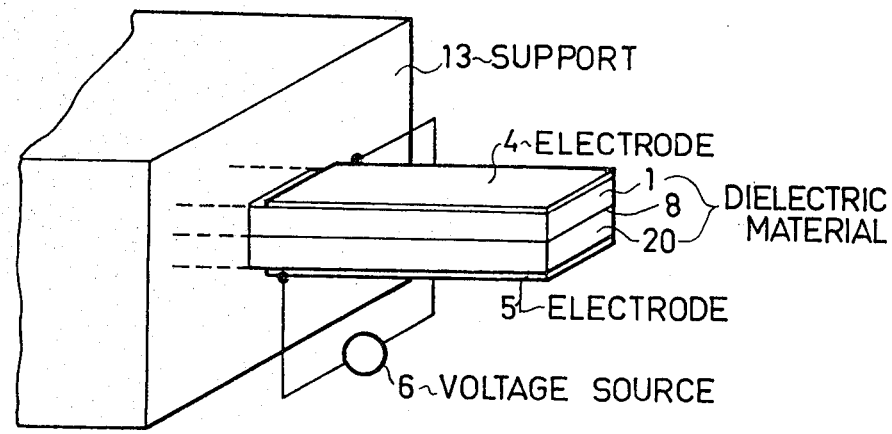
FIG. 7
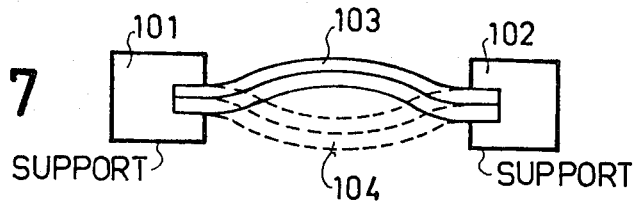
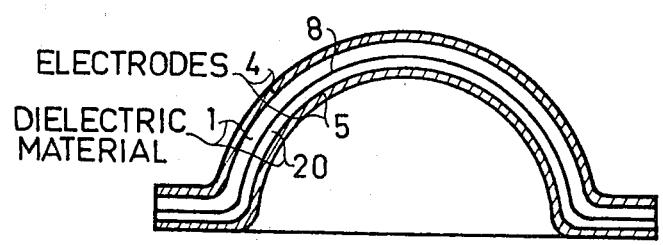
FIG. 8

BIMORPH TRANSDUCER MADE FROM POLYMER MATERIAL

BACKGROUND OF THE INVENTION

The present invention relates to electromechanical transducers which may, if necessary, also be pyroelectric obtained from polymer materials having a composite structure so as to obtain bimorph operation.

Polymer materials exist which can be given significant piezoelectric and pyroelectric properties as a result of certain treatments. This is the case, for example, with polyvinylidene fluoride (PVF$_2$) and similar compounds such as polyvinyl chloride, polyvinyl fluoride, etc., as well as copolymers of these materials.

A device operating in bimorph manner can be obtained from a material of this type. For example a sheet of this material is taken and the two faces of electrodes are covered so as to form a capacitor. The bimorph element is obtained by associating with the said structure another sheet which can be inert from the standpoint of piezoelectric operation. When a voltage is applied between the two electrodes of the piezoelectric sheet it undergoes a normal stress and a tangential elongation.

Due to the mechanical coupling the other sheet is stretched at the interface. Finally the device bends, which represents a mechanical displacement by rotation much greater than that devolving from the constriction of the sheet.

However, there is only a relatively limited range of piezoelectric polymer materials and the piezoelectric properties only appear after a polarization treatment which can in certain cases be complicated. The constraint of a particular piezoelectric range often makes it impossible to choose materials having the desired mechanical properties.

The production of an electrostatic transducer from a random non-piezoelectric dielectric is also known. When exposed to an electrical field it undergoes an electrostatic pressure in the field direction, i.e. stretching in the perpendicular plane. However, this deformation is a quadratic effect of the electrical field and is therefore independent of the direction of said field.

BRIEF SUMMARY OF THE INVENTION

To overcome these difficulties the invention proposes the use within a bimorph structure of a transducer sheet made from a dielectric polymer material having no piezoelectric properties, but having an excess electric charge in order to linearize its operation.

It more specifically relates to a bimorph transducer, whose active areas comprise at least two superimposed and mechanically integral sheets, whereof at least one is a dielectric polymer material, and electrodes making it possible to apply an electrical field to at least one of the dielectric sheets, wherein the electrodes enclose at least one dielectric, but non-piezoelectric sheet carrying a permanent electric charge.

BRIEF DESCRIPTION OF THE DRAWINGS

The invention is described in greater detail hereinafter relative to non-limitative embodiments and the attached drawings, wherein show:

FIGS. 6 to 9 bimorph transducers according to the invention.

DETAILED DESCRIPTION OF THE PREFERRED EMBODIMENTS

It is known that any dielectric exposed to an electrical field applied between two opposite faces undergoes an electrostatic pressure between its two faces which is proportional to the square of the field applied.

This electrostatic phenomenon is more particularly applicable to an electretized dielectric, i.e. carrying an excess permanent electric charge. This permanent charge creates a constant equivalent field $E_e$, which must be added to the field $E_a$ applied via the electrodes for the evaluation of the proportional deformation $dl/l$ undergone by the electrode, i.e.

$$dl/l = A(E_a + E_e)^2$$

in which A is a constant having dimensions which are the inverse of the square of an electric field. By developing this expression we obtain:

$$dl/l = A(E_a^2 + E_e^2 + 2E_aE_e)$$

and it can be seen that the proportional variation of the dimension of the dielectric is the sum, to within a constant factor, of a constant term $E_e^2$ and two terms variable with the applied field, a quadratic term $E_a^2$ and a linear term $2E_aE_e$.

In all cases where the applied field is small compared with the equivalent field, the quadratic term as a low value compared with the linear term. It can then be taken that the relative variation of the dimension of the electretized dielectric is a linear function of the field applied, i.e. the voltage applied to the electrodes.

The deformation considered up to then is the constriction which brings together the two opposite faces between which the voltage is applied and which will be called normal deformation. The dielectric, like any solid undergoing a constriction in a particular direction, extends in isotropic manner in the plane perpendicular to said direction. This tangential deformation is linked with the normal deformation by the Poisson's ratio of the material. Consequently if the normal deformation is a linear function of an applied electric field, the associated tangential deformation is also a linear function of the same field (for low values of the proportional elongations).

The invention proposes to utilize this property for a permanently charged dielectric sheet, whose two faces are covered with conductive layers constituting two opposite electrodes between which a voltage source or generator is applied. When an exciting voltage is applied between the two electrodes, the sheet behaves like an electromechanical transducer and, besides the normal deformation, undergoes a tangential deformation, which is a linear function of the voltage applied.

Like the normal deformation, this tangential deformation is very small, but it can be utilized in a bimorph structure like that which can be obtained with a true piezoelectric material by associating it with another material which mechanically resists the tangential deformation and gives rise to an inward curvature of the assembly.

Figure 1:
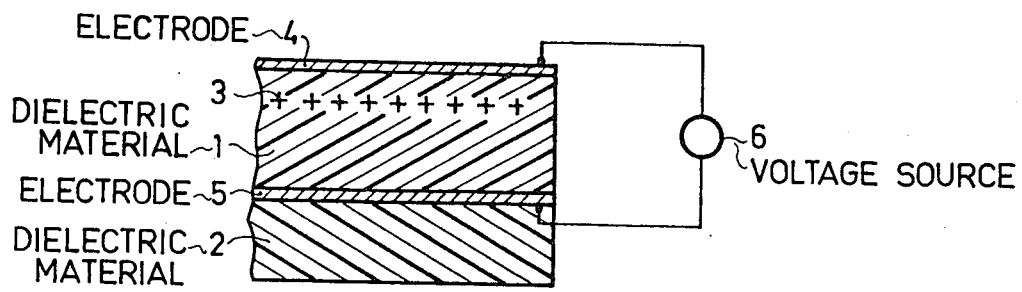
FIG. 1 a sectional view of a bimorph transducer structure according to the invention.

A first possibility is shown in FIG. 1 in the form of a composite structure having two dielectrics 1 and 2 made from polymer materials in sheet form. Dielectric 1 carries a permanent charge distributed in a plane located at a certain distance from the surface. This charge is represented by the small crosses 3. The two faces of dielectric 1 are covered with a metal coating constituting electrodes 4 and 5. Along the interface containing electrode 5, the two dielectrics are mechanically coupled by a connection ensuring the transmission of the tangential forces of dielectric 1 to dielectric 2 without one sheet sliding with respect to the other. This connection can be obtained by glueing, for example with an epoxy glue. A voltage source 6 is connected to electrodes 4 and 5.

Figure 2:
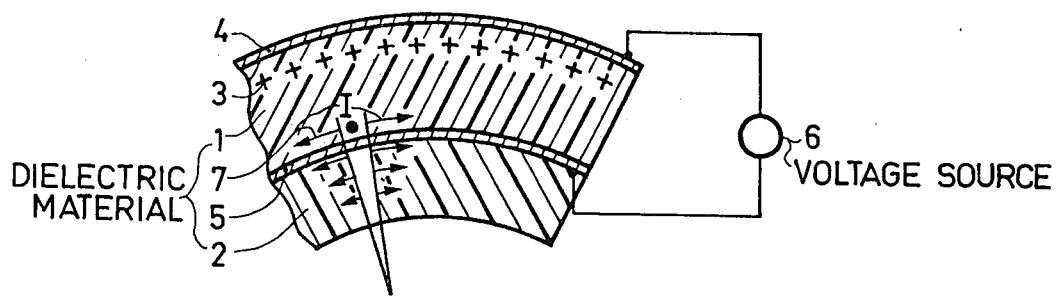
FIG. 2 the same structure live.

Under the action of the voltage applied and which acts additionally to the equivalent voltage associated with the permanent charges 3, the assembly is deformed in the manner shown in FIG. 2. At all points sheet 1 undergoes an elongation under the action of the tangential forces, in the manner indicated by arrows 7 around point I. These forces more particularly occur along the interface with dielectric 2. As the interface transmits tangential forces, the dielectric 2 is exposed to the same elongation forces along the interface. However, the free surface of sheet 2 is not exposed to any external stress. Thus, in the thickness of sheet 2 there is a gradient of tangential forces which brings about the bending of the device. This phenomenon is linearly controlled by a voltage applied to the dielectric 1 containing a permanent charge.

The device will function in the same way if dielectric 2 is replaced by a layer of another material such as a metallic material.

It is also possible to stack more than two sheets. The device will function if at least one of these sheets is a permanently charged dielectric layer between whose faces can be applied an external voltage and if the sheets are mechanically connected so as to ensure the transmission of the tangential forces without any sliding taking place.

Figure 3:
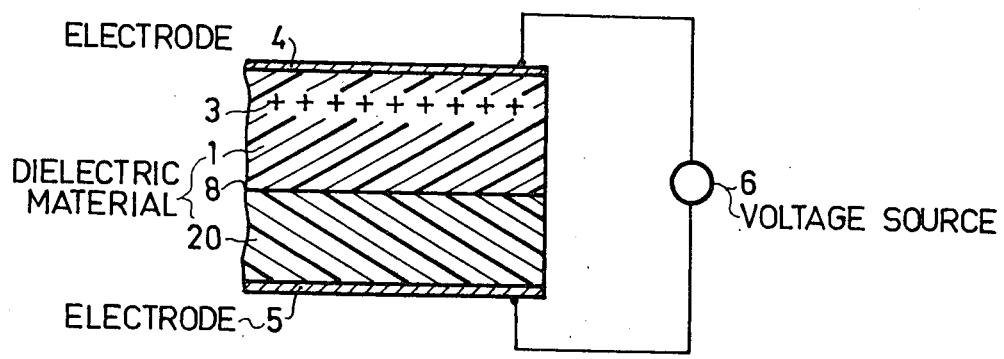
FIG. 3 a second transducer structure according to the invention.

Another possibility for a structure is shown in FIG. 3. The dielectric sheet 1 carrying the electric charge 3 is joined along interface 8 to another dielectric sheet 20. Here again the connection between sheets 1 and 20 ensures the transmission of tangential forces without any sliding. The free surfaces of dielectrics 1 and 20 are covered with a conductive layer constituting electrodes 4 and 5 to which is connected a voltage source 6.

The two dielectrics 1 and 20 are selected in such a way that under the effect of the voltage applied between the electrodes the intrinsic deformations induced in the two dielectrics differ, and in particular the tangential deformations.

Thus, on applying a voltage between electrodes 4 and 5 of the structure of FIG. 3, said structure is deformed and bends as in the aforementioned case because said two components 1 and 2 are exposed to different tangential forces. Here again for a not too high voltage range the relative deformation obtained varies in linear manner with the voltage applied.

If the charge is distributed at the interface 8 of the two sheets 1 and 20, the relative mechanical deformation is directly proportional to the voltage applied and it is possible to calculate the proportionality factor, which is the analog of the corresponding piezoelectric coefficient of a true piezoelectric material. This coefficient is a function of the characteristics of the two dielectrics and is calculated as a function of the dielectric constants, the elastic coefficients and the charge introduced.

For example, in the case of a charge of $5 \cdot 10^{-5}$ C.cm$^{-2}$, distributed at the interface of a 25 micron thick polypropylene sheet and a 6 micron thick Mylar sheet a piezoelectric coefficient g of 0.5 V.m.N$^{-1}$ is obtained.

It is possible to use other pairs of materials, e.g. polypropylene and PVC, polyester and PVC-based copolymer, etc.

These two embodiments of structures relate to cases where only low exciting voltages are used. In the case of high exciting voltages it is no longer possible to consider that the relative deformations are linear functions of the voltages applied or supplied.

Figure 4:
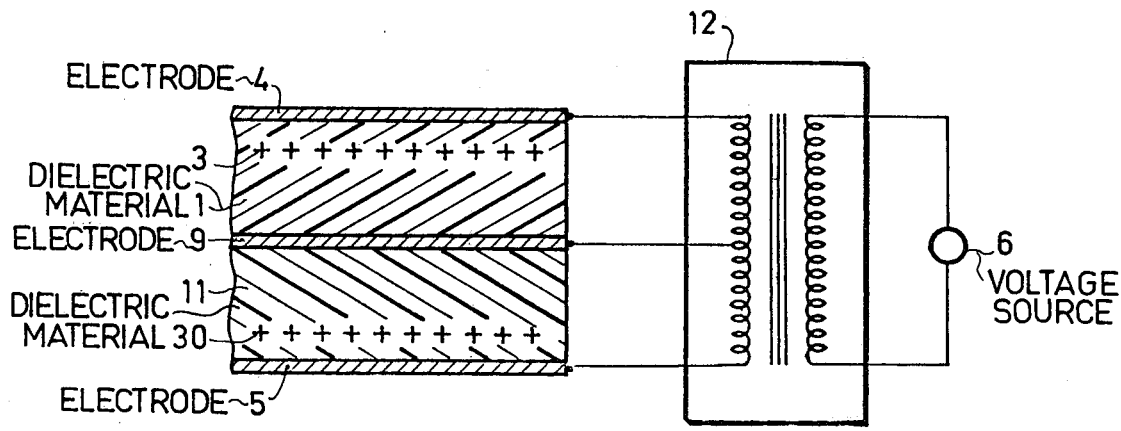
FIG. 4 a third structure according to the invention.

FIG. 4 shows a structure making it possible to overcome this limitation and which can be used for high stresses. It is a composite structure comprising two identical dielectric polymer sheets 1 and 11 and three electrodes 4, 5 and 9.

Sheets 1 and 11 carry the same permanent charges 3 and 30 distributed over symmetrical planes with respect to the interface. The two sheets adhere to the central electrode 9 in such a way that they cannot slide relative to one another under the effect of tangential forces. The free surfaces of this structure carry the electrodes 4 and 5.

Electrodes 4, 5 and 9 are energized by the voltage source 6 via transformer 12 applying voltages of the same amplitude but opposite phase to sheets 1 and 11. In addition, the two sheets are exposed to the same equivalent voltage associated with the permanent charge introduced into these sheets.

The two dielectrics 1 and 11 undergo different relative deformations, because they are respectively proportional to the squares of the sum and the difference of the equivalent voltage and the applied voltage. Thus, the resulting deformation is once again constituted by bending. Moreover, the resulting relative deformation from the difference of the stresses undergone by each of the sheets is proportional to the voltage applied because the quadratic terms cancel one another out.

Figure 5:
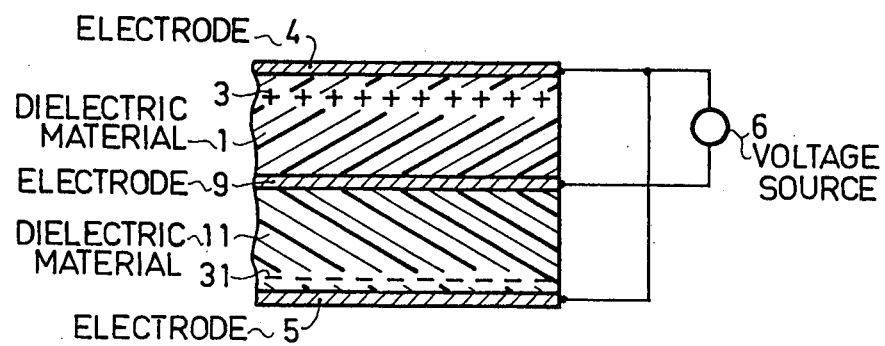
FIG. 5 a variant of the above structure.

The same effect is obtained with the structure of FIG. 5 where two identical dielectrics 1 and 11 carry equal charges of opposite sign 3 and 31 and are exposed to identical voltages in phase.

The identical sheets 1 and 11 of FIGS. 4 or 5 can be composite sheets, constituted by a number of layers of different materials, whereof at least one is a dielectric layer carrying a permanent charge. More generally in any of the structures described the homogeneous sheets carrying a permanent charge excess can be replaced by heterogeneous sheets constituted by a dielectric film able to store electric charges and integral with a sheet chosen for its mechanical properties.

Different laminated structures will now be described, whose characteristic is to respond to an electrical stress by a bending action, thereby likening them to bimorph elements.

They are all constituted by a number of dielectric layers, whereof at least one contains a permanent charge, and at least two conductive layers permitting the action of a voltage.

The different layers are mechanically connected in such a way that under the action of tangential forces one layer does not slide relative to the other. It is obviously possible to define active ranges characterized by the absence of sliding and they are surrounded by areas where sliding prevents the transmission of tangential forces.

In order to obtain, for example, a structure like that of FIG. 3 and in which two dielectric sheets are associated without an intermediate electrode it is possible to start with a sheet of a synthetic polymer, e.g. polypropylene, an electric charge is introduced by corona discharge or by electron or ion bombardment and the second polymer dissolved in a suitable solvent is deposited on one of the surfaces by pouring, dipping, rolling, atomizing, etc., and the solvent is then evaporated.

A variant of this stage is to deposit the second polymer in the form of a monomer in solution and to carry out in situ polymerization, e.g. by suitable illumination if it is a photopolymerizable compound, like the photopolymer Photocryl.

Another variant of this stage is to assemble by means of a polymerizable epoxy glue another dielectric sheet following treatment of the surfaces to be adhered by electrical etching or ion bombardment. This treatment makes it possible in a single operation to prepare the surfaces and to introduce the electric charge necessary for producing the device. The electric charge can also be introduced after the assembly of the two layers by using an appropriate charged particle implantation energy. The assembly of the two dielectric layers can be directly obtained by joint extrusion of the two polymers used. In this case the electric charge is introduced afterwards. The composite sheet constituted by the welded polymer sheets is then metallized on its two faces and the structure shown in FIG. 3 is obtained.

In order to obtain structures having an electrode between two dielectric layers, as shown in FIGS. 1 or 4, it is obviously necessary to fit the intermediate electrode before assembling the two sheets and, apart from joint extrusion, the processes referred to hereinbefore can be used.

The thickness of the laminated structures can vary very considerably from a few dozen to a few hundred microns as a function of their intended use. The relative thicknesses of the different constituent layers can be determined as a function of their dielectric constant and their mechanical elasticity.

The material obtained in the form of planar sheets can be used in the construction of cylinders, cones, wound bands, etc. It can also be hot worked on a mould making it possible to obtain spheres, spherical caps, frustums, closed cylinders, protuberances on a plane, etc. It is then advantageous to introduce the permanent electrical charge following the hot working process.

The applications essentially relate to pressure and displacement transducers, such as hydrophones, microphones, etc. This material can also be used for "actuators" such as telephone receivers, loudspeakers, motors, etc.

In the case of structures incorporating sheets carrying a charge excess one of the sheets can convert electrical energy into mechanical energy and the other can fulfil the opposite function.

This laminated structure with a bimorph piezoelectric behaviour clearly has a pyroelectric effect and can therefore be used for all applications of this effect, e.g. the detection of hot spots, the detection of intruders, infrared image formation, etc.

In exemplified manner three transducers obtainable with this composite material having a bimorph piezoelectric effect will be described hereinafter.

The first transducer is shown in FIG. 6 in the form of a bar, one of whose ends is fitted onto a fixed support 13. This bar is constituted by two strips of different dielectric polymers 1 and 20 adhered or welded along the interface 8 on which is distributed the permanent electric charge giving the structure its piezoelectric properties. The upper and lower faces are covered with metallic layers forming electrodes 4 and 5 connected to a voltage source 6. On applying the voltage between the two electrodes 4 and 5, the bar bends and its free end is moved by a significant amount. If an alternating voltage is applied to the electrodes it can vibrate.

One example of the application thereof is to the video disk. A lens or mirror can be fixed to the free end of the bar, so that by a voltage it is possible to accurately control their limited displacement. The mirror can be planar or can have a variable curvature, whilst being formed directly by a metallization of the structure.

A second embodiment of a transducer using this material is shown in FIG. 7. It is a bimorph strip braced between two fixed supports 101, 102 in order to form a bistable element able to assume the two stable positions 103, 104 shown in FIG. 7. Passage from one to another takes place by applying a suitably polarized voltage to the structure. Possible applications are electrical contacts, mirrors, etc.

Another embodiment of a transducer formed from this material is the non-developable, self-supporting shape shown in cross-section in FIG. 8. It can be used for forming the active diaphragm of a microphone. Its operation is the same as that of the conventional electret microphone with an air gap. Its advantage is that it is not sensitive to moisture. For the construction of this device dielectrics 1 and 20 can be welded in the form of planar or jointly extruded sheets. The assembly is then hot worked to a spherical cap, whose inner and outer surfaces are covered with a metal coating forming the control electrodes 4 and 5. The diameter of the spherical cap is typically between a few centimeters and one or two dozen centimeters, the thickness being approximately 25 microns.

This configuration, covered with good reflecting, metallic electrodes can form a mirror, whose radius of curvature and consequently vergence is controlled by a voltage. Thus, an accurate and inexpensive optical component is obtained, which can be used in the video disk.

Figure 9:
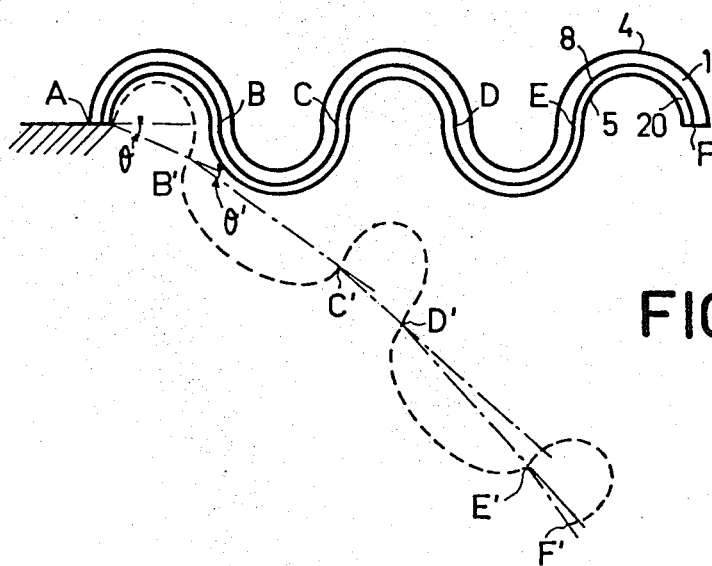

The third embodiment of a transducer has an undulating surface as shown in FIG. 9. It is constituted by two sheets welded along the interface 8 of electrically charged dielectric 1 and uncharged dielectric 20 in accordance with the structure shown in FIG. 3. The two faces are metallized giving electrodes 4 and 5 between which a voltage is applied. Dielectric 1 is subject to greater elongation than dielectric 20 and the deformation of interface 8 is shown by dotted lines.

The half-undulation shown in FIG. 9 by AB is deformed in accordance with AB′ with an angular displacement $\theta$ of point B, because the radius of curvature of the undulation decreases due to the bending direction imposed by the respective elongations of the two layers 1 and 20. However, the half-undulation BC opens and has a supplementary angular displacement $\theta$ along B′C′. In the same way the following half-undulations CD, DE, EF successively close and open and follow C′D′, D′E′, E′F′.

Finally the resulting displacement of the free side of this undulating surface parallel to the undulations is increased compared with that of the planar surface of the same size.

Figure 10:
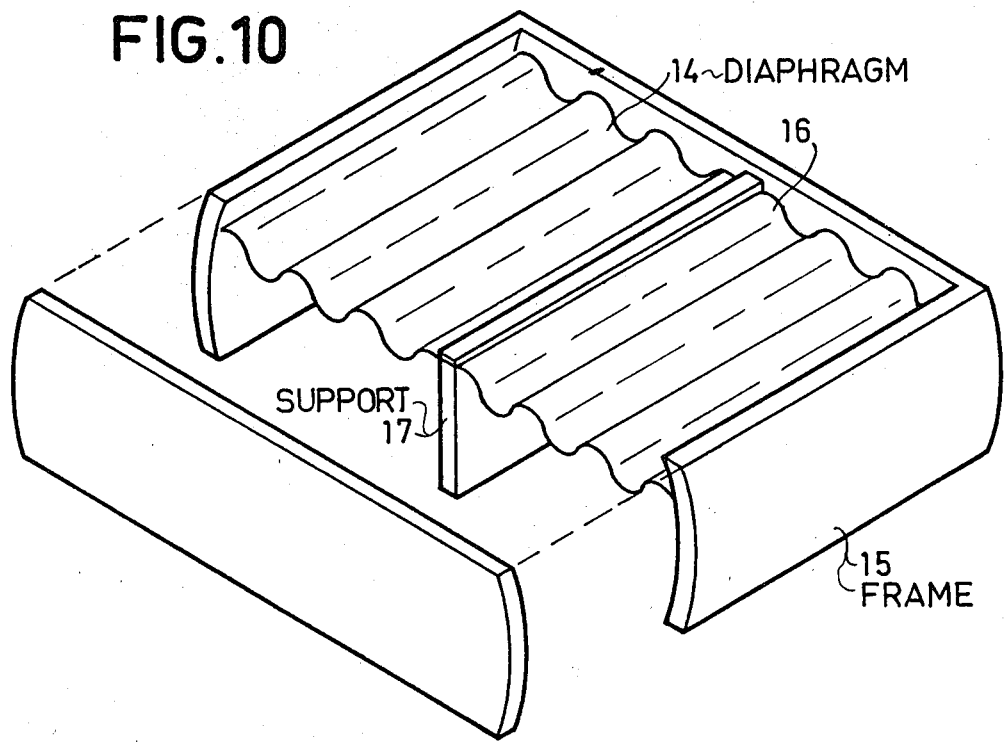
FIG. 10 a device incorporating a bimorph transducer according to the invention.

This undulating surface can form a loudspeaker diaphragm, as shown in FIG. 10. The active part of the loudspeaker is the rectangular undulating diaphragm 14. It is surrounded by the rigid frame 15, one side of which has been removed to make the drawing easier to understand. The diaphragm is attached by the median undulation 16 to a fixed support 17 and the edges of the diaphragm can slide along the walls of the frame under the action of a voltage applied between the two faces and which brings about the deformation explained by FIG. 9.

Many more transducers can be obtained on the basis of a composite structure whose characteristic is that it has a bimorph piezoelectric behaviour without containing a true piezoelectric element and the embodiments given hereinbefore in no way limit the present invention.

What is claimed is:

1. A bi morph transducer, whose active areas comprise:
   at least two sheets joined along an interface, one of said sheets being made from a dielectric polymer material carrying an excess of electric charge, and two electrodes for creating an electrical field across the thickness of said charged material, wherein the joining of said sheets prevents them from sliding against each other, the elastic characteristics of said sheets being differentiated for causing said active areas to bend under the action of said electrical field; one of said electrodes being located at said interface.

2. A transducer according to claim 1, wherein the other one of said sheets is a dielectric sheet.

3. A transducer according to claim 1, wherein the other one of said sheets is a conductive sheet.

4. A transducer according to claim 1, wherein it comprises at least one third sheet mechanically fixed to the other sheets.

5. A transducer according to claim 1, wherein at least one of the sheets carrying an excess of electric charge is heterogeneous and is formed by a layer able to store electric charges and a layer of another material chosen for its mechanical properties, the two layers being mechanically fixed to one another.

6. A transducer according to claim 1, wherein it forms a fitted bar.

7. A transducer according to claim 1, wherein it forms a bistable element.

8. A transducer according to claim 1, wherein it forms a non-developable, self-supporting configuration.

9. A transducer according to claim 1, wherein it forms an undulating surface.

10. A bimorph transducer whose active areas comprise:
    at least two dielectric sheets commonly joined along a first electrode;
    second and third electrodes surrounding respective dielectric sheets;
    said first, second and third electrodes for creating an electrical field across the thickness of said dielectric sheets wherein the joining of said sheets to said first electrode prevents said sheets from sliding relative to each other, the elastic characteristics of said sheets being differentiated by causing said active areas to bend under the action of said electric field;
    said dielectric sheets carrying an excess of electric charge;
    the two dielectric sheets are identical and carry identical charges, said transducer being associated with exciting means making it possible to expose it to voltages of the same amplitude but opposite phase.

11. A bimorph transducer whose active areas comprise:
    at least two dielectric sheets commonly joined along a first electrode;
    second and third electrodes surrounding respective dielectric sheets;
    said first, second and third electrodes for creating an electrical field across the thickness of said dielectric sheets wherein the joining of said sheets to said first electrode prevents said sheets from sliding relative to each other, the elastic characteristics of said sheets being differentiated for causing said active areas to bend under the action of said electrical field;
    said dielectric sheets carrying an excess of electric charge;
    the two dielectric sheets are identical and carry identical charges of the opposite sign, said transducer being associated with exciting means making it possible to expose it to voltages of the same amplitude and phase.

* * * * *